United States Patent [19]
Clayton et al.

[11] Patent Number: 5,998,294
[45] Date of Patent: Dec. 7, 1999

[54] METHOD FOR FORMING IMPROVED ELECTRICAL CONTACTS ON NON-PLANAR STRUCTURES

[75] Inventors: Stanley R. Clayton; Stephen D. Russell; Oswald I. Csanadi; Shannon D. Kasa; Charles A. Young, all of San Diego, Calif.

[73] Assignee: The United States of America as represented by the Secretary of the Navy, Washington, D.C.

[21] Appl. No.: 09/069,388

[22] Filed: Apr. 29, 1998

[51] Int. Cl.⁶ .......................... H01L 21/265; H01L 21/28
[52] U.S. Cl. .......................... 438/659; 438/525; 438/649; 438/683
[58] Field of Search .................. 438/525, 528, 438/533, 630, 649, 651, 655, 659, 682, 683

[56] References Cited

U.S. PATENT DOCUMENTS

| | | | |
|---|---|---|---|
| 3,993,018 | 11/1976 | Kranik et al. | 118/52 |
| 4,474,623 | 10/1984 | Adlerstein | 438/412 |
| 4,670,968 | 6/1987 | Mikami et al. | 438/518 |
| 4,876,211 | 10/1989 | Kanber et al. | 438/379 |
| 4,906,591 | 3/1990 | Okumura | 438/252 |
| 5,094,980 | 3/1992 | Shepela | 438/533 |
| 5,102,826 | 4/1992 | Ohshima et al. | 438/528 |
| 5,162,263 | 11/1992 | Kunishima et al. | 438/535 |
| 5,217,924 | 6/1993 | Rodder et al. | 438/301 |
| 5,223,445 | 6/1993 | Fuse | 438/302 |
| 5,270,227 | 12/1993 | Kameyama et al. | 438/234 |
| 5,286,678 | 2/1994 | Rastogi | 438/301 |
| 5,302,549 | 4/1994 | Santangelo et al. | 438/530 |
| 5,315,144 | 5/1994 | Cherne | 257/351 |
| 5,536,676 | 7/1996 | Cheng et al. | 438/535 |
| 5,620,926 | 4/1997 | Itoh | 438/530 |
| 5,659,194 | 8/1997 | Iwamatsu et al. | 257/377 |
| 5,710,054 | 1/1998 | Gardner et al. | 438/304 |

FOREIGN PATENT DOCUMENTS

| | | | |
|---|---|---|---|
| 4-142732 | 5/1992 | Japan | 438/169 |

*Primary Examiner*—T. N. Quach
*Attorney, Agent, or Firm*—Harvey Fendelman; Michael A. Kagan; Peter A. Lipovsky

[57] ABSTRACT

A method is provided for improving silicide formation, and the electrical contact provided thereby, on non-planar silicon structures. In this method, a semiconductor device structure is initially formed having non-planar surface regions. A metal layer is deposited on the non-planar surfaces. The metal deposition process step is followed by an off-axis implantation of non-dopant ions, causing a mixing of the metal and silicon atoms at the metal and non-planar silicon structure interface. The off-axes implantation also serves to disrupt the native silicon dioxide layer between the silicon and metal layers regions. Thermal processing is then used to form silicide on the non-planar surfaces of the semiconductor silicon structure.

24 Claims, 6 Drawing Sheets

METHOD FOR FORMING IMPROVED ELECTRICAL CONTACTS ON NON-PLANAR STRUCTURES

BACKGROUND OF THE INVENTION

This invention relates generally to circuits utilizing silicon technology and more particularly to the nature of electrical contacts as used with this technology.

Metal silicides have found widespread use in the microelectronics industry. When formed on the surface of a transistor, for example, the silicide allows better electrical contact between the underlying silicon structure of the transistor and the metal signal and power lines used with the transistor. Metal silicide also lowers the resistivity of the silicon regions on which it is formed. These properties of silicide allow transistor devices and other silicon structures to operate at higher speeds.

The self-aligned silicide process, commonly referred to as the salicide process, is an attractive method of forming silicide on a transistor. The steps of this prior art process are illustrated in FIGS. 1A–1D.

Referring to FIG. 1A, a transistor's structure 10 is first formed using techniques well-known in the art of semiconductor device processing. As can be seen, transistor device 10 has a non-planar structure with different regions of the device being located at different levels. Typically, not all surfaces of the device are parallel to the surface of a substrate 12, upon which the device is formed. Typically, such devices include oxide spacers 14 on either side of a polysilicon surface 16 lying over a gate region 17 of the device. Under certain conditions, silicon dioxide spacers 14 will not react in the salicide process to form silicide.

Referring now to FIG. 1B, the salicide process includes the deposition of a metal layer 18. In FIG. 1C, a rapid thermal processing step (heat 19 being shown) is then completed, in which a metal silicide 20 is formed on the planar surfaces of transistor structure 10. In FIG. 1D, a selective etch is performed to remove unreacted metal from the planar and non-planar surfaces, leaving metal silicide 20 over the source/drain regions and over the gate interconnect regions of the transistor structure.

It is known that silicon dioxide does not react well in silicide formation. In general, a native silicon dioxide layer will exist upon the silicon surfaces of a silicon structure, such as that depicted in FIG. 1, and will lie between the silicon and the metal deposited to form silicide. The native silicon dioxide layer inhibits the formation of silicide and since the silicon dioxide layer is generally of an uneven thickness, the degree of inhibition of silicide formation will vary across the silicon substrate being processed. This leads to silicide that is rough and non-uniform, resulting in a device resistivity that will vary from point to point, creating non-uniformities within the device itself as well as within batches of devices that are fabricated. Excessively thin silicide may in some regions cause device failure while in other instances thinness or thickness of the silicide can cause problems during photolithographic steps as light may not be specularly reflected as appropriate.

It is known to reduce this non-uniformity by using ion implantation normal to the silicon. The implantation disrupts the silicon dioxide layer and allows more uniform silicide formation. Such a method, however, has not proven suitable in cases where non-planar surfaces exist on a silicon structure. The need thus exists for a method of forming improved contact layers on silicon structures that have not only have a native silicon dioxide layer on contact surfaces but also have non-planar surfaces.

SUMMARY OF THE INVENTION

The invention provides a method for improving silicide formation, and the electrical contact provided thereby, on non-planar silicon structures. In this method, a semiconductor device structure is initially formed having non-planar surface regions. A metal layer is deposited on the non-planar surfaces of the silicon device structure. In distinction from prior art techniques, the metal deposition process step is followed by an off-axis implantation of non-dopant ions, to cause a mixing of the metal and silicon atoms at the metal and non-planar silicon structure interface. The off-axes implantation also serves to disrupt the native silicon dioxide layer between the silicon and metal layers regions. Thermal processing is then used to form silicide on the non-planar surfaces of the semiconductor silicon structure.

OBJECTS OF THE INVENTION

It is an object of the invention to improve electrical contact to silicon technology.

Another object of the invention is to provide an improved method for forming silicide.

Another object of the invention is to enhance the uniformity of silicide formation.

Yet another object of the invention is to improve silicide formation on planar and non-planar silicon structures.

Other objects, advantages and new features of the invention will become apparent from the following detailed description of the invention when considered in conjunction with the accompanied drawings.

DESCRIPTION OF THE PREFERRED EMBODIMENT

FIGS. 2A–F show successive steps for a method for forming improved electrical contacts on non-planar structures according to the invention.

Figure 1A:
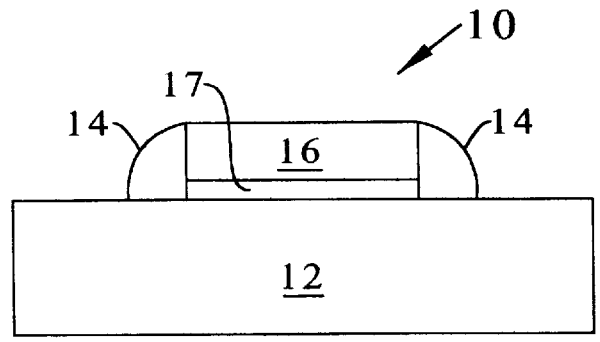
FIGS. 1A–1D illustrate the typical implementation of the self-aligned silicide processes as known in the art of semiconductor device processing.
Figure 1B:
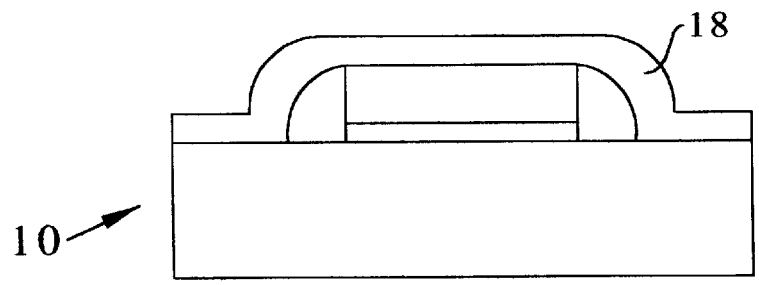
Figure 1C:
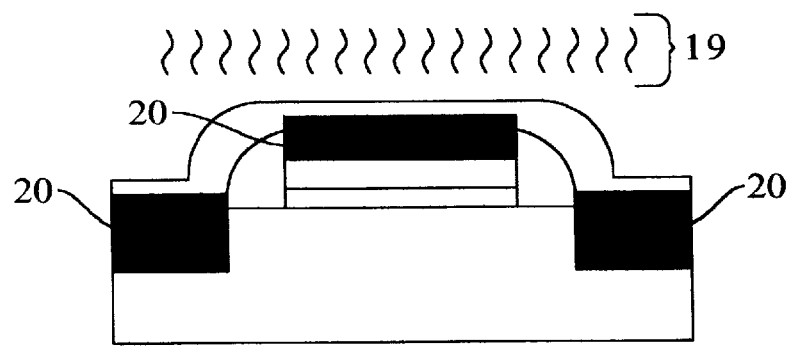
Figure 1D:
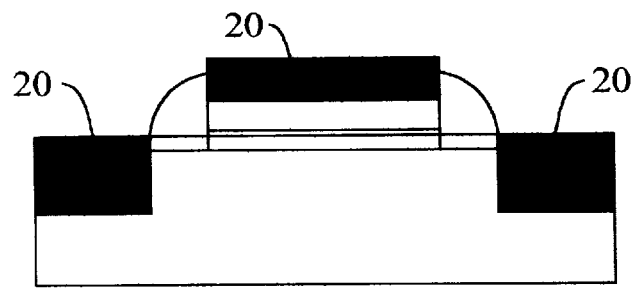
Figure 2A:
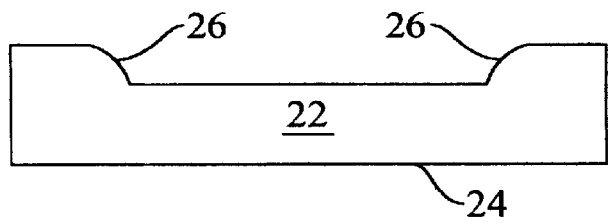
FIGS. 2A–2F illustrate a representative process of improving silicide formation according to the invention.
Figure 2B:
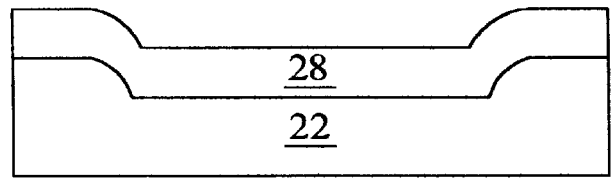

As shown in FIG. 2A, a silicon structure 22, such as a semiconductor device structure, is formed having a substantially planar side 24 and having a non-planar surface 26 opposite side 24. In FIG. 2B, a metal layer 28 is formed on silicon structure 22 by means of physical vapor deposition such as sputtering or evaporation, or by chemical vapor deposition and the like. Typically, the thickness of this metal will lie in the range of 25–100 nanometers. Some examples of the material from which this metal can be chosen are titanium, platinum, nickel, tungsten, molybdenum, tantalum and cobalt. In a preferred embodiment, 50 nanometers of titanium was sputter deposited at ambient temperature.

Figure 2C:
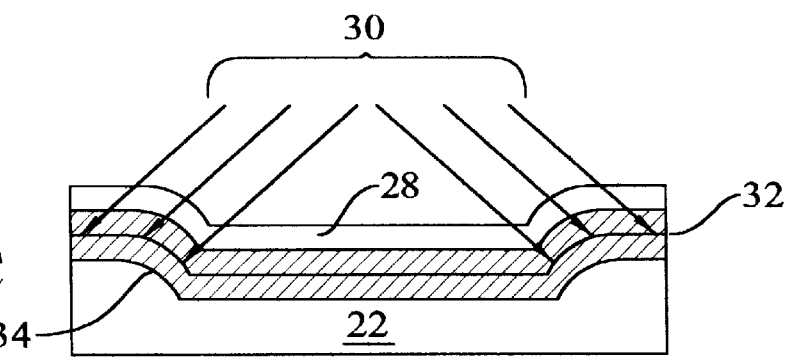

In FIG. 2C, the process of the invention is illustrated further in which ions 30 are implanted into and through metal layer 28, through non-planar surface 32 and into silicon structure 22 to form a mixed atom region 34 in which migration of metal 28 into silicon structure 22, and silicon structure 22 into metal 28, is promoted. Typically, a native silicon dioxide layer will be present on surface 32 of silicon structure 22. The ion implantation serves to disrupt this silicon dioxide layer to further promote uniform silicide formation.

According to the invention, it has been found that silicide formation is enhanced both at the planar and specifically at the non-planar surfaces of a silicon structure by utilizing off-axes implantation. Ions are implanted at an angle that is oblique to the substantially planar side 24 of the silicon structure. In other words, implantation is at an angle that is neither parallel nor perpendicular to planar side 24 of structure 22. It has been found that the off-angle implanted ions cause a redistribution of the atoms at the planar and non-planar metal-silicon interface 32 as shown in FIG. 2C. Though the implant angle can be any angle oblique to surface 24, in a preferred embodiment of the invention an implant angle of 7° from the normal was used with satisfactory results. Different ions can, of course, be implanted to obtain desired atom mixing.

In a preferred embodiment, non-dopant ions (i.e. ions that will not act as acceptors or donors in silicon) were used. For the 50 nanometer titanium metal layer described above, a $1 \times 10^{15}$ per square centimeter dose of $Si^{28}$ ions at an energy level of 65 keV or a $3.5 \times 10^{15}$ per square centimeter dose of Ar ions at a level of 90 keV were used. Energies ranging from about 25 keV to about 100 keV are considered usable depending on the thickness or type or metal layer with the accompanying dose being greater than or equal to about $1 \times 10^{15}$ ions per square centimeter.

Figure 2D:
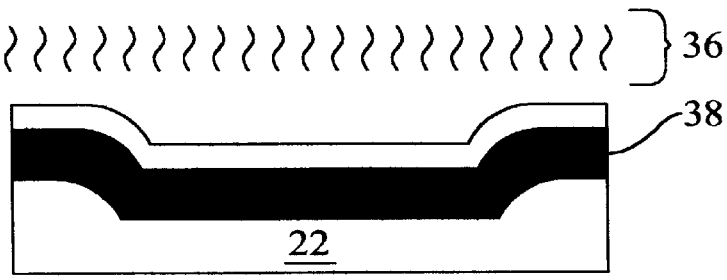

FIG. 2D illustrates the results of rapid thermal processing (heat 36 being shown) to form metal silicide 38 on both the planar and non-planar surfaces of silicon structure 22. Typically, this thermal processing will include an anneal at temperatures between 650° C. and 700° C. for 30–90 seconds in a flowing nitrogen ambient of about 48 SCCM. For the implanted titanium layer described above, an anneal at 675° C. for 60 seconds was chosen.

Figure 2E:
Figure 2F:
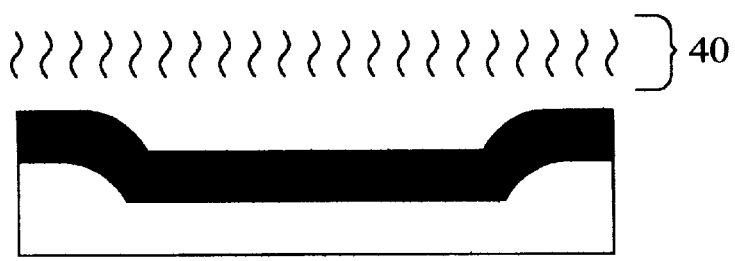

Referring now to FIG. 2E, a wet etch is performed to remove any unreacted titanium and in FIG. 2F an optional second anneal that is typically at temperatures between 800° C. and 900° C. for 30–90 seconds may be performed (heat 40 being shown). For the 50 nanometer titanium metal layer described above, this anneal was chosen to take place at 850° C. for 60 seconds in a nitrogen ambient. The temperature ramp rate for both the specific first and second anneals described above is 45° C. per second, with the typical ramp rate being in the range of 10° C. per second to 300° C. per second.

Though not described earlier, a pre-amorphization implant into the silicon structure, prior to metal deposition, may be used to control the depth of the silicide formation on both the planar and non-planar surfaces. In this case, the energy of the implanted ions will be chosen to select the depth (thickness) of the subsequent silicide layer, and the dose of the implant will be selected to amorphize (i.e. destroy the crystalline nature) of the silicon to allow for the improved atom mixing and silicide formation.

The method disclosed herein is considered to be applicable to group IV, III–V and II–VI semiconductor device structures.

Figure 3A:
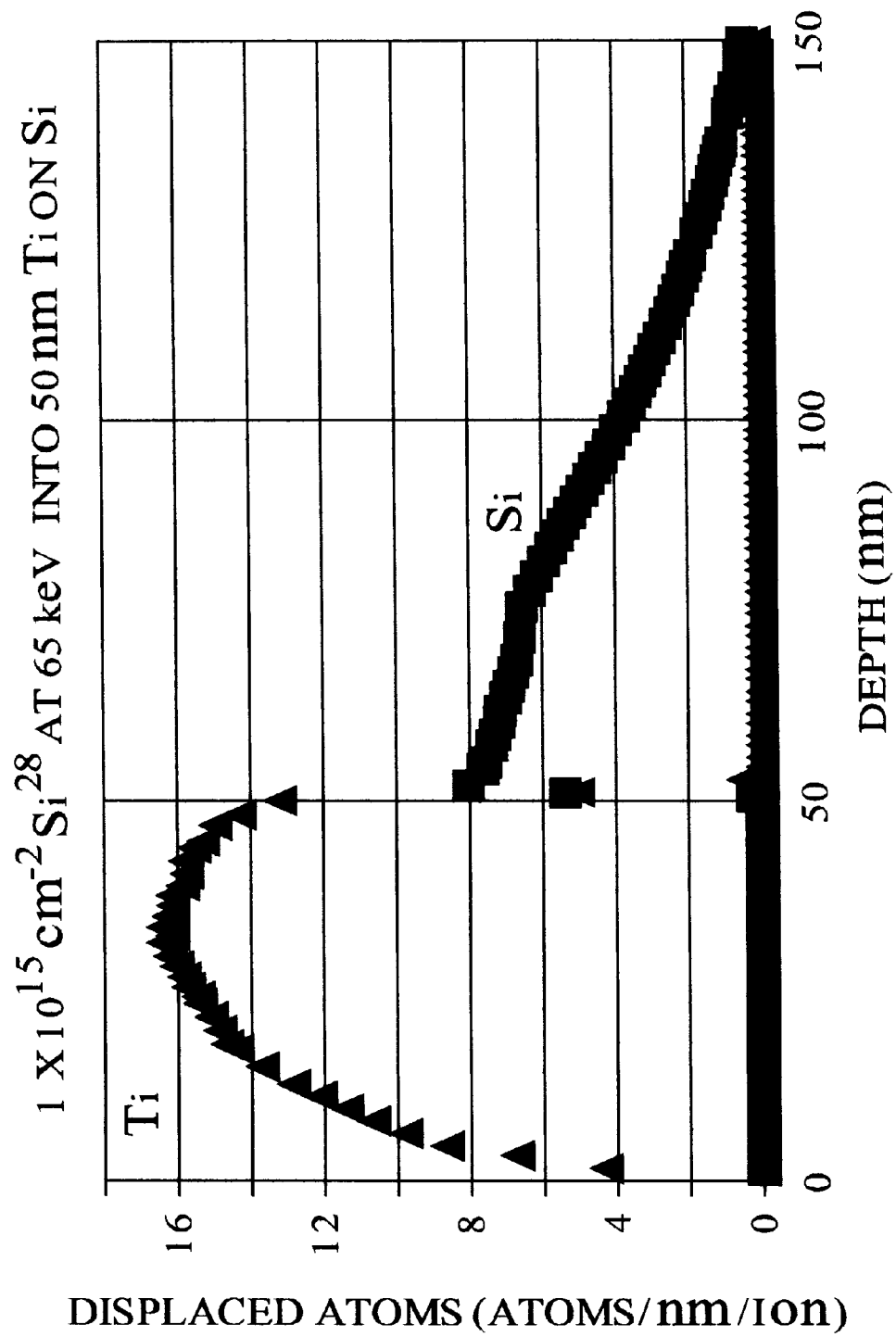
FIG. 3A illustrates the displacement of metal and silicon ions as accomplished by silicon implantation according to the invention.

Referring to FIG. 3A, displaced atoms versus depth is shown for a $1 \times 10^{15}$ per square centimeter dose of $Si^{28}$ ions at an energy level 65 keV as implanted into 50 nanometers of titanium on a silicon structure. The triangles illustrate a high degree of titanium displacement within the initial 50 nanometer titanium metal layer. An accompanying displacement of silicon atoms (shown as squares) is also illustrated. The atom displacement, and its accompanying atom migration, is promoted by the off-axes ion implantation and has the net effect of enhancing uniform silicide formation on both planar and non-planar silicon structures.

Figure 3B:
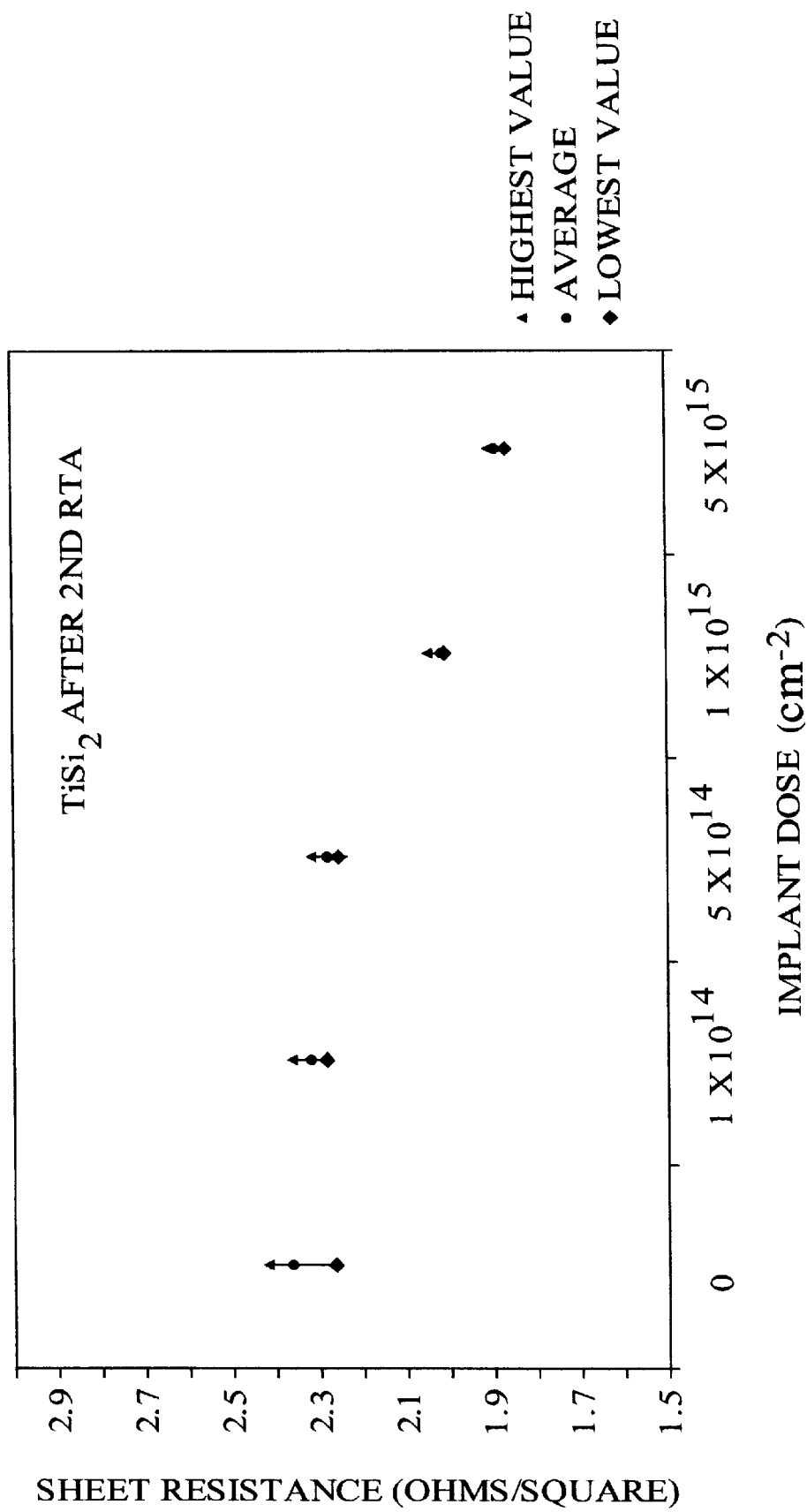
FIG. 3B illustrates sheet resistance versus implant dose corresponding to silicon implantation according to the invention.

In FIG. 3B, the sheet resistance (the resistance of the interface between semiconductor active regions, such as the source, drain, etc.) of a semiconductor device structure and the electrical contacts made thereto, is shown plotted versus silicon implant dose. In this example, silicon ion ($Si^{28}$) implantation into 50 nanometers of titanium was performed at 65 keV, at a dosage of at least $1 \times 10^{15}$ per centimeter squared, sheet resistance below 2 ohms per square is obtained with little variation across a semiconductor substrate.

Figure 4A:
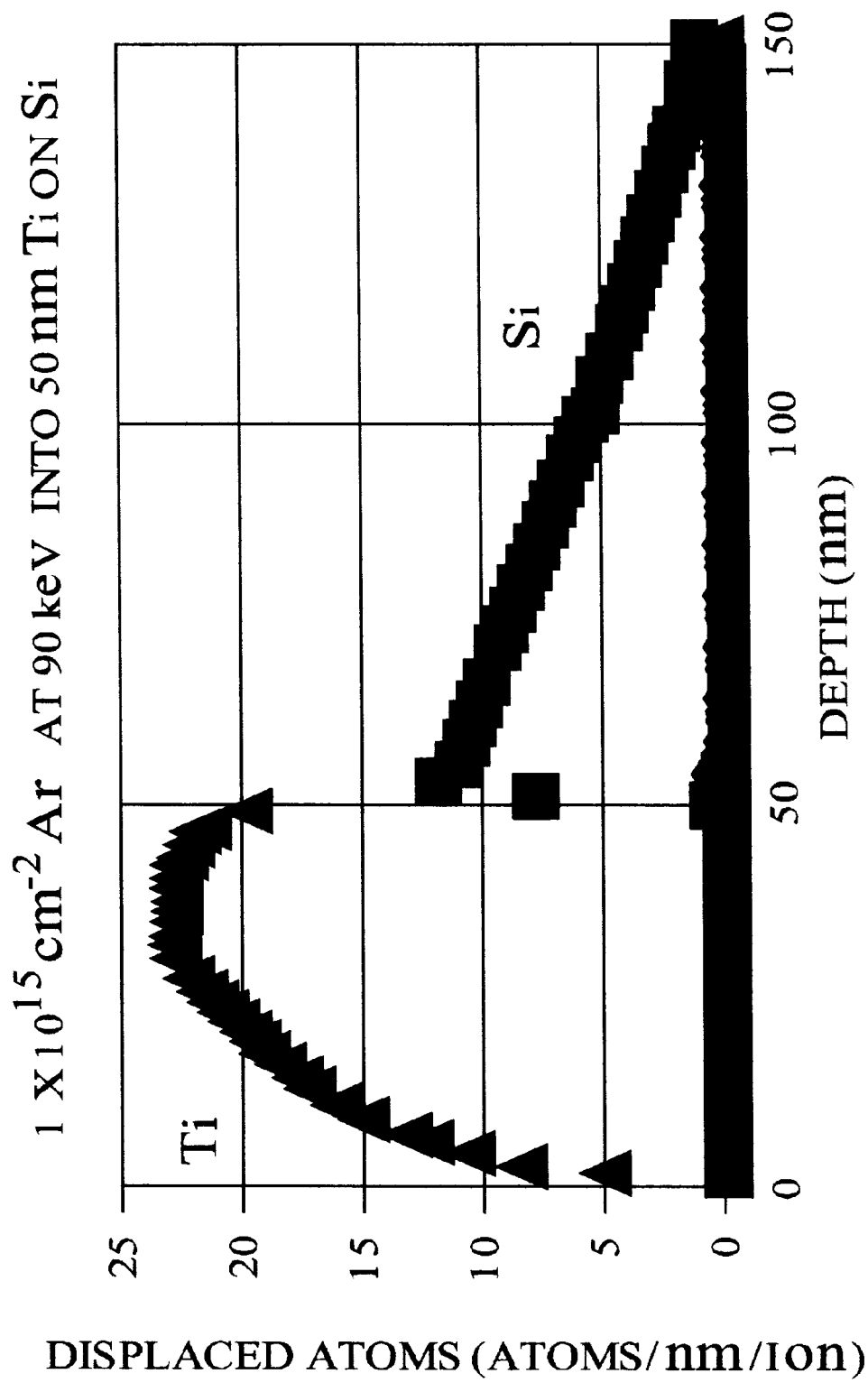
FIG. 4A and FIG. 4B are similar to FIGS. 3A and 3B except argon is used as an implantation ion.
Figure 4B:
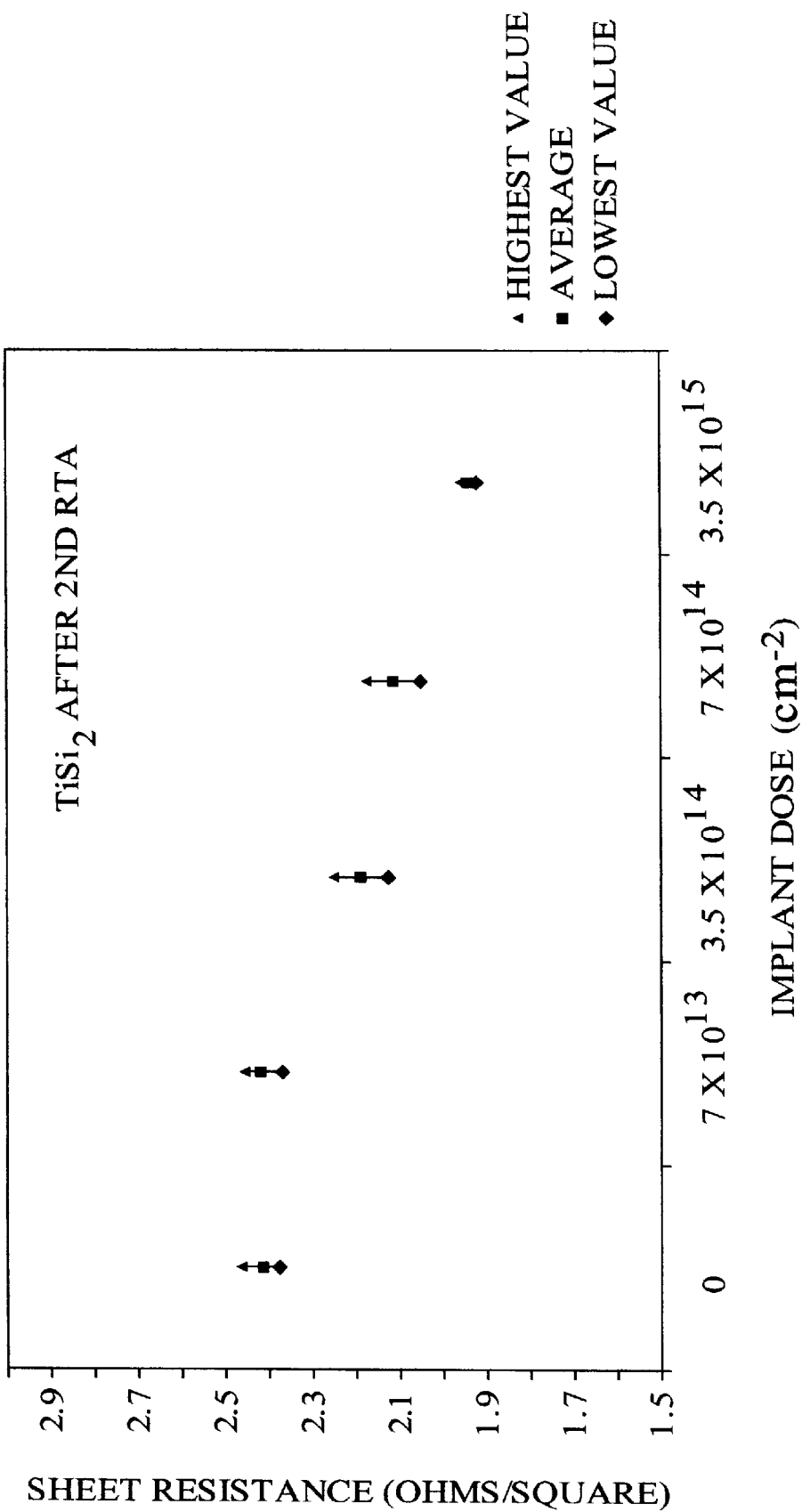

FIGS. 4A and 4B are similar to FIGS. 3A and 3B but are for an argon implantation into 50 nanometers of titanium performed at 90 keV at a dosage of at least $3.5 \times 10^{15}$ per centimeter squared.

Obviously, many modifications and variations of the invention are possible in light of the above teachings. It is therefore to be understood that within the scope of the appended claims the invention may be practiced otherwise than as has been specifically described.

What is claimed is:

1. A method for forming silicide comprising:
   providing a silicon structure having a substantially planar side and a side that has a non-planar surface and that is opposite said substantially planar side;
   forming a metal layer on said non-planar surface;
   implanting ions into and through said metal layer and through said non-planar surface and into said silicon structure to form a mixed atom region that includes the interface of said metal layer and said non-planar surface, in which said ions are implanted at an angle oblique to said substantially planar side of said silicon structure; and
   heat treating said silicon structure and said metal layer to form a metal silicide layer in said mixed atom region.

2. A method according to claim 1 in which said ions are non-dopant ions.

3. A method according to claim 2 in which said non-dopant ions are selected from the group consisting of silicon and argon.

4. A method according to claim 2 in which said metal layer is selected from the group consisting of titanium, platinum, nickel, tungsten, molybdenum, tantalum and cobalt.

5. A method according to claim 1 in which said metal layer is titanium having a thickness of about 50 nanometers.

6. A method according to claim 5 in which said ions are silicon ions are implanted at an energy of about 65 keV and a dose of about $1 \times 10^{15}$ per centimeter square.

7. A method according to claim 5 in which said ions are argon ions are implanted at an energy of about 90 keV and a dose of about $3.5 \times 10^{15}$ per centimeter square.

8. A method according to claim 1 in which said angle is about 7 degrees from the normal of said substantially planar side of said silicon structure.

9. A method according to claim 1 in which a pre-amorphization step occurs between said step of providing a silicon structure and said step of forming a metal layer, in which said pre-amorphization step includes an ion implant into said silicon structure to amorphize said silicon structure to a preselected depth.

10. A method for forming silicide comprising:

providing a silicon structure having a substantially planar side and a side that has a non-planar surface and that is opposite said substantially planar side;

forming a metal layer on said non-planar surface;

implanting non-dopant ions into and through said metal layer and through said non-planar surface and into said silicon structure to form a mixed atom region that includes the interface of said metal layer and said non-planar surface, in which said ions are implanted at an angle oblique to said substantially planar side of said silicon structure;

annealing said silicon structure and said metal layer to form a metal silicide layer in said mixed atom region;

removing portions of said metal layer that have not become part of said metal silicide layer; and annealing said metal silicide layer.

11. A method according to claim 10 in which said non-dopant ions are selected from the group consisting of silicon and argon.

12. A method according to claim 10 in which said metal layer is selected from the group consisting of titanium, platinum, nickel, tungsten, molybdenum, tantalum and cobalt.

13. A method according to claim 10 in which said annealing of said silicon structure and said metal layer is carried out at a temperature in a range between about 650° C. and 700° C.

14. A method according to claim 10 in which said annealing of said metal silicide layer is carried out at a temperature in a range between about 800° C. and 900° C.

15. A method according to claim 10 in which said angle is about 7° from the normal of said substantially planar side of said silicon structure.

16. A method according to claim 10 in which a pre-amorphization step occurs between said step of providing a silicon structure and said step of forming a metal layer, in which said pre-amorphization step includes an ion implant into said silicon structure to amorphize said silicon structure to a preselected depth.

17. A method for forming silicide comprising:

providing a silicon structure having a substantially planar side and a side that has a non-planar surface and that is opposite said substantially planar side, said non-planar surface being covered by a silicon dioxide layer;

forming a metal layer on said silicon dioxide layer;

implanting non-dopant ions into and through said metal layer and into and through said silicon dioxide layer and through said non-planar surface and into said silicon structure to form a mixed atom region that includes the interfaces of said metal layer and said silicon dioxide layer, and said silicon dioxide layer and said non-planar surface, in which said non-dopant ions are implanted at an angle that is about 7° from the normal of said substantially planar side of said silicon structure;

annealing said metal layer, silicon dioxide layer and said silicon structure at a temperature in a range between about 650° C. and 700° C. to form a metal silicide layer in said mixed atom region;

removing portions of said metal layer that have not become part of said metal silicide layer; and annealing said metal silicide layer at a temperature in a range between about 800° C. and 900° C.

18. A method according to claim 15 in which said non-dopant ions are selected from the group consisting of silicon and argon.

19. A method according to claim 17 in which said metal layer is selected from the group consisting of titanium, platinum, nickel, tungsten, molybdenum, tantalum and cobalt.

20. A method according to claim 17 in which said metal layer is titanium.

21. A method according to claim 20 in which said metal layer is titanium having a thickness of about 50 nanometers.

22. A method according to claim 21 in which said ions are silicon ions are implanted at an energy of about 65 keV and a dose of about $1 \times 10^{15}$ per centimeter square.

23. A method according to claim 21 in which said ions are argon ions are implanted at an energy of about 90 keV and a dose of about $3.5 \times 10^{15}$ per centimeter square.

24. A method according to claim 17 in which a pre-amorphization step occurs between said step of providing a silicon structure and said step of forming a metal layer, in which said pre-amorphization step includes an ion implant into said silicon structure to amorphize said silicon structure to a preselected depth.

* * * * *